(12) United States Patent
Yang et al.

(10) Patent No.: US 6,593,590 B1
(45) Date of Patent: Jul. 15, 2003

(54) TEST STRUCTURE APPARATUS FOR MEASURING STANDBY CURRENT IN FLASH MEMORY DEVICES

(75) Inventors: Nian Yang, San Jose, CA (US); Zhigang Wang, San Jose, CA (US); Tien-Chun Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/112,976

(22) Filed: Mar. 28, 2002

(51) Int. Cl.[7] .................. H01L 29/06; H01L 31/072; H01L 31/109; H01L 31/0328
(52) U.S. Cl. .................. 257/48; 438/11; 438/14; 438/15; 438/18
(58) Field of Search .................. 257/48, 536–538; 438/11, 14, 15, 18

(56) References Cited

U.S. PATENT DOCUMENTS 6,452,208 B1 * 9/2002 Susami .................. 257/48
2002/0125473 A1 * 9/2002 Yoshida .................. 257/48

* cited by examiner

Primary Examiner—Hoai Ho
(74) Attorney, Agent, or Firm—LaRiviere, Grubman & Payne, LLP

(57) ABSTRACT

A flash memory microelectronic chip (1000) is formed with at least one integral test structure (100) for electrical measurement of transistor leakage current from the low voltage peripheral transistors. The invention is a very wide finger-type transistor (9, 10) with minimum channel length and a width of approximately 150,000 $\mu$m, equal to the estimated total width of the same type of periphery transistors in the chip circuit. One low voltage NMOS (9) and one low voltage PMOS finger-type transistor (10) allow monitoring of the standby current contribution from these two types of periphery transistors. Regular current or voltage tests can be applied to the test structure, thus providing information on the correlation of standby currents with single transistor off-state leakage currents.

20 Claims, 3 Drawing Sheets

TEST STRUCTURE APPARATUS FOR MEASURING STANDBY CURRENT IN FLASH MEMORY DEVICES

TECHNICAL FIELD

The present invention relates generally to the field of microelectronic circuit fabrication, more specifically to fabrication of flash memory microelectronic circuits, and most specifically to forming test structures on a microelectronic flash memory to facilitate measurement of the standby current of the finished flash memory chip.

BACKGROUND ART

Flash memory chips generally are formed with an array of memory cells centrally located and adjoined by memory cell periphery transistors (forming a control circuit) on one or more sides of the array. As flash memory technology progresses, the memory density and speed become higher and higher. The control circuit becomes more and more complex with the use of low voltage peripheral transistors for high speed core memory cell control. The peripheral transistors have to employ thin gate oxide and short channel dimensions, and as a result, the short channel effect becomes a major concern, affecting control of the off-state leakage currents. In standby mode, the leakage current induced by these low voltage peripheral transistors can cause the flash memory chip standby current to go beyond the design limit and cause excessive power consumption and reduce the product yields. In order to correlate product standby current with periphery transistors for chip development, there is a need to implement an effective means of measuring the chip standby current.

DISCLOSURE OF INVENTION

The present invention is a microelectronic test circuit structure for simulating and measuring transistor leakage current contributed by the low voltage peripheral transistors which occurs in standby mode. One or more test circuit structure or structures are formed on the chip during the manufacturing process for the operating device. The test structure may be located within or adjacent to the operational device(s) on the chip. The present invention provides surrogate test devices within or outside of operational circuit devices to measure parameters such as currents or voltages which are representative of those present at or created by operational circuit components, without the need for introducing special test points at the operational component, thereby eliminating the possible introduction of potential defect sources at the operational component. Additional test structures having other channel widths may be simultaneously included for engineering or testing purposes. Additionally, the test structure can also be designed for simulating other types of transistors, including intrinsic NMOS transistors, Z-type NMOS transistors and high-voltage transistors. The test circuit structure may also be modified to include diode or capacitor type protection.

The exemplary test circuit transistor structure of the present invention comprises a wide gate, finger-type transistor arrangement with minimum channel gate length (L). The channel gate width (W) of this finger-type transistor arrangement is designed to be equal to the estimated total gate widths of the periphery transistors of that type. For example, there typically are two types of periphery transistors, commonly referred to as low voltage NMOS and low voltage PMOS transistors, each having a gate width ranging from 1.6 Am to 340 Am. Each of these types of periphery transistors can have a total channel width (W) in the range of approximately 1.0 $\mu$m to approximately 150,000 $\mu$m on the chip. This large channel gate width variation can be used to generate standby current in the standby mode. The gate width of the test circuit transistor structure of the present invention is preferably large enough to represent the total widths of the periphery circuit transistors within the flash memory chip device. The invention implements one low voltage NMOS finger-type transistor and one low voltage PMOS finger-type transistor to simulate the standby current contribution from the corresponding multitudes of the two types of periphery transistors in the flash memory chip device. Regular electrical tests such as current-voltage tests can then be applied to the test structure, thus providing information on the correlation of the actual product standby currents with single transistor off-state leakage currents.

BRIEF DESCRIPTION OF THE DRAWING

For fuller understanding of the present invention, reference is made to the accompanying drawing. Reference numbers refer to the same or equivalent parts of the present invention throughout the several figures of the drawing.

MODES FOR CARRYING OUT THE INVENTION

The present invention is one or more test circuit transistor structures, which is/are formed on a flash memory chip during the chip manufacturing process, for simulating peripheral transistor leakage current in flash memory devices. In the following discussion, the invention is described in the singular for clarity of explanation; this is not intended to mean or imply that only one such test structure may be formed nor that the instant invention is limited to the formation of a single test structure. The test circuit structure 100 (9, 10) of the present invention is a wide-channel finger-type transistor arrangement with minimum channel length. The gate width (W) of this finger-type transistor arrangement is designed to be equal to the total widths of the gates of the periphery transistors. Other test structures may be formed to test less than total widths or other combinations, as desired. For example, and as best seen from FIG. 2, two types of periphery transistors, i.e., low voltage NMOS 9 and low voltage PMOS transistors 10, can have a total gate width (W) that can vary in the range of approximately 1.0 $\mu$m to approximately 150,000 $\mu$m, which is the total width of the gates of these types of transistors in the flash memory device. The use of these wide gate transistors can help gather standby current information of the flash memory device in the standby mode.

Figure 1:
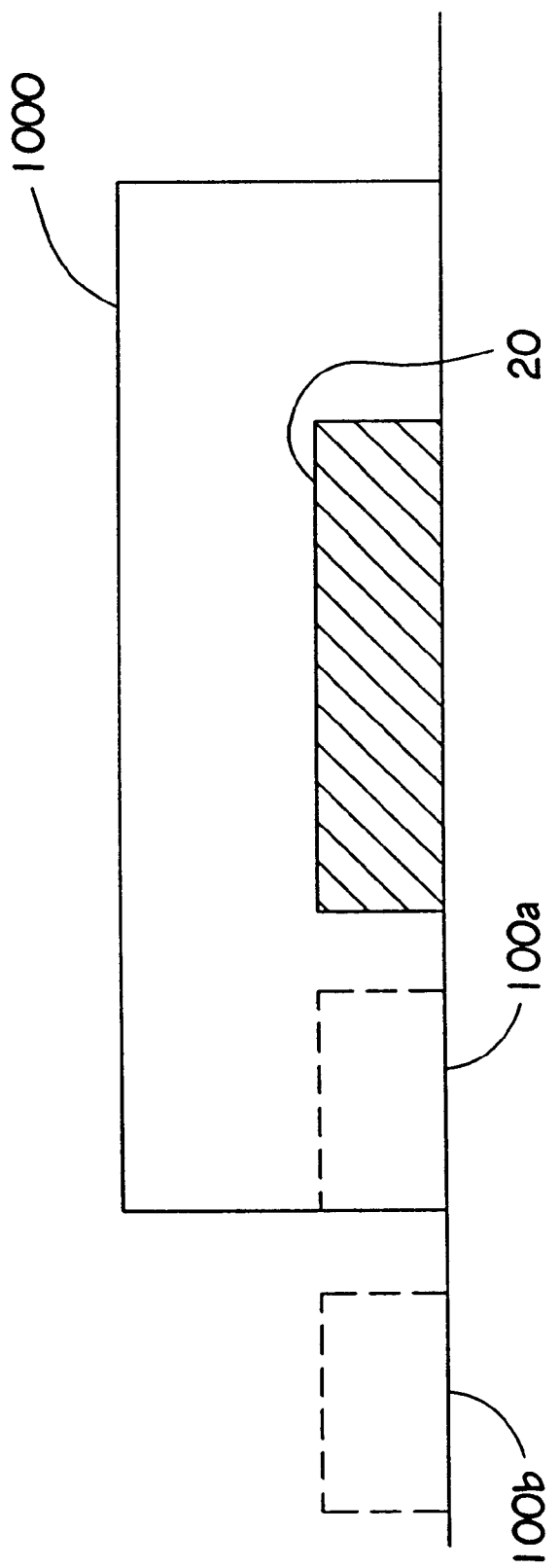
FIG. 1 is an exemplary cross-sectional embodiment of in-board and out-board test circuit structure arrangements for testing standby current in a flash memory chip device according to the present invention.

Referring now to FIG. 1, an exemplary test circuit structure 100 (9, 10) for simulating and testing standby current performance in a flash memory chip (device 1000) is shown in cross-sectional view. FIG. 1 represents a core memory array 20 fabricated to a stage for testing standby current performance. Test circuit structure 100 (9, 10) may be disposed in-board (100a) or out-board (100b) device 1000. Test circuit structure 100 (9, 10) may, or may not, depending upon customer requirements, be a permanent (in-board,) circuit portion of a completed flash memory device 1000.

Figure 2:
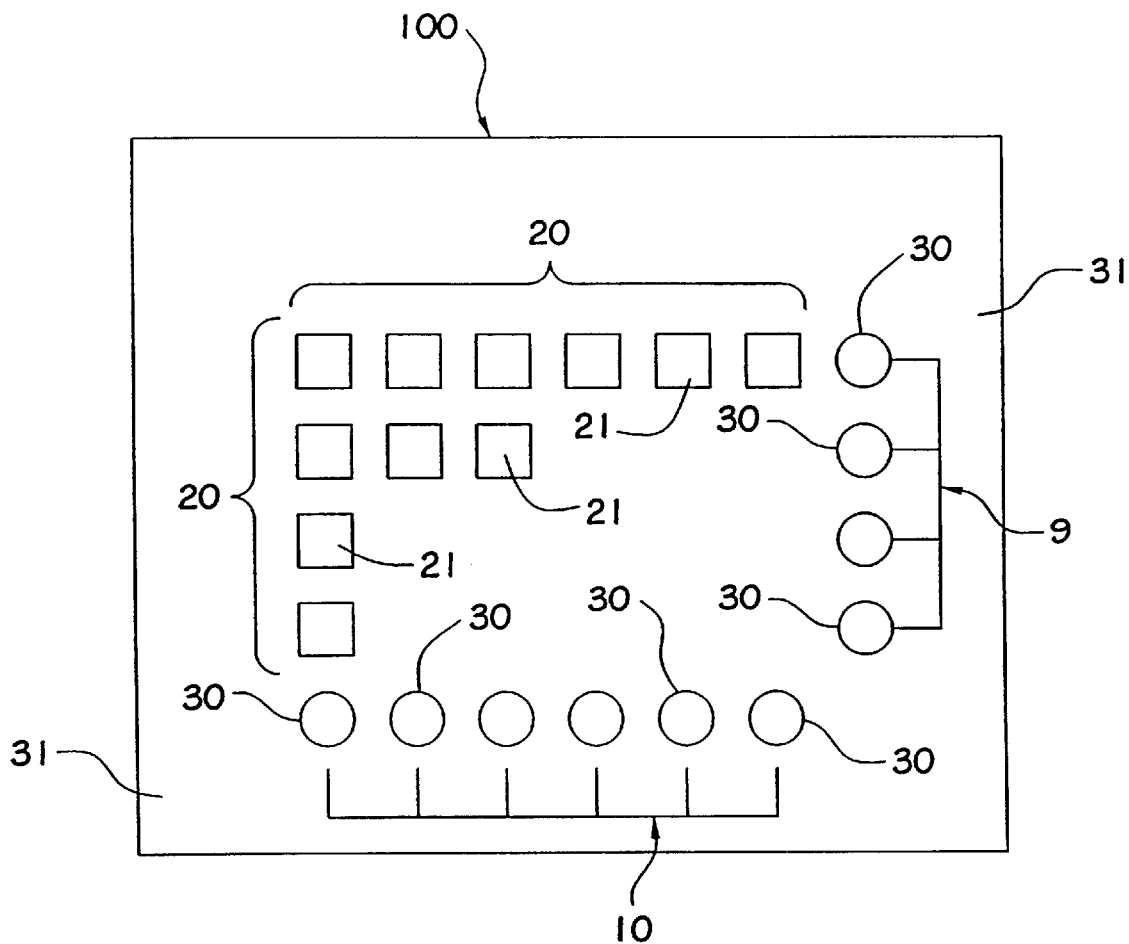
FIG. 2 is a plan view of an exemplary test structure for measuring standby current in a 4×6 flash memory chip array according to the present invention.

Referring now to FIG. 2, exemplary test structure 100 for measuring standby current in flash memory device 1000 according to the present invention is shown in plan view. FIG. 2 shows a partial 4×6 core memory array 20 of memory cells 21 with corresponding peripheral low voltage control transistors 30 constructed on a substrate 31 on two edges of the array. It is to be understood that the quantity of core memory cells 20 and control transistors 30 may be of any number and location, being located on one or more sides of substrate 31 depending on the design requirements of flash memory chip device 1000. Also shown is NMOS finger-type transistor 9 and PMOS finger-type transistor 10. Again, it is to be understood that either or both of these finger transistors may be of any suitable dimension or number, being located on one or more sides of substrate 31.

Figure 3:
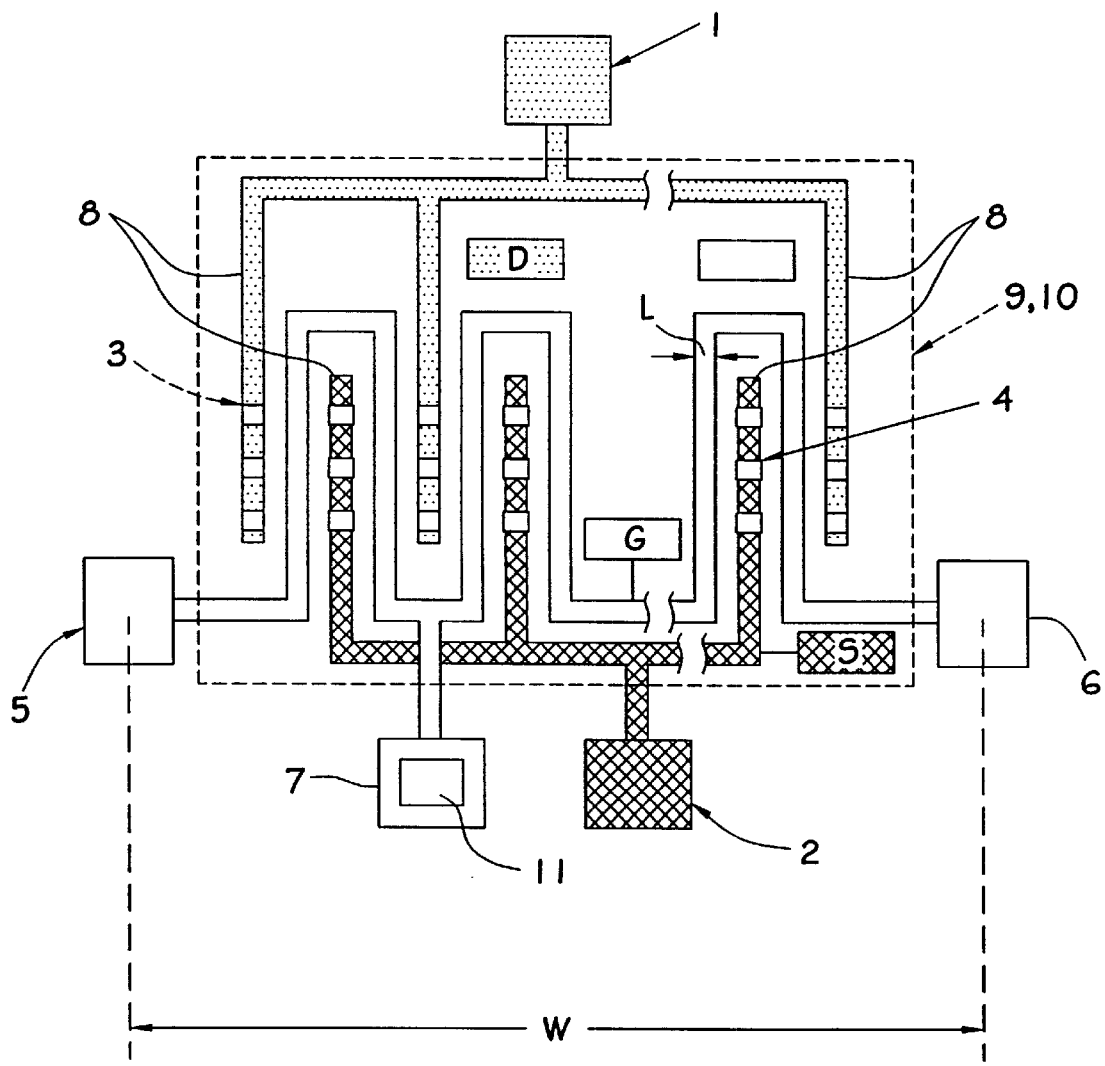
FIG. 3 is a fragmented plan view of a finger-type transistor arrangement constructed according to the present invention.

Referring now to FIG. 3, a general plan view of an exemplary finger-type transistor 9, 10 constructed according to the present invention is shown. FIG. 3 shows multiple arrangement finger-type transistors 9, 10. It is understood that the number of fingers 8 is chosen such that the total gate width of the finger transistor is equal to the total gate width of the number of peripheral control transistors 30 for which monitoring is desired. In transistors 9, 10, drain 1 and source 2 are constructed in the conventional manner. The fingers 8 are formed, one each for a source 2 extension to each control transistor 30 and one each for drain 1 extension to each control transistor 30. Each finger 8 is formed with one or more drain contacts 3 or source contacts 4, in the drain and source fingers 8 respectively. Also, as seen in FIG. 3, transistor gate pads 5, 6 and 7 are indicated. Note that the gate pads 5, 6 and 7 need to be shorted during electrical testing to eliminate RC delay. It should also be noted that the finger-type transistors of the present invention may be optionally modified to include diode or capacitor type circuit protection 11 via attachment to pad 7.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more". All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, material, and fabrication detail may be made without departing from the spirit and scope of the inventions as set forth in the appended claims. No claim herein is to be construed under the provisions of 35 U.S.C. 112, sixth paragraph, unless the element is expressly recited using the phrase "means for".

INDUSTRIAL APPLICABILITY

The present invention may be used in the microelectronic circuit manufacturing industry to provide surrogate test devices within or outside of operational circuit devices to measure parameters such as currents or voltages which are representative of those present at or created by operational circuit components, without the need for introducing special test points at the operational component, thereby eliminating the possible introduction of potential defect sources at the operational component. The surrogate test devices are formed concurrently with the operational components, using the normal component manufacturing processes. Thus the test devices are representative of the operational components and the data obtained from them is representative of operational component data.

What is claimed:

1. A test structure for testing a flash memory chip device comprising:
    a substrate;
    an array of memory cells on the substrate;
    peripheral control transistors associated with the array of memory cells; and
    means for testing the peripheral transistors simulated leakage current, the means further comprising at least one finger transistor having
        a gate length,
        a gate width equal to the gate width of at least one peripheral transistor, and
        a number of fingers electrically connected to the peripheral transistors.

2. A structure as in claim 1 wherein the gate length is in the range of approximately 0.07 $\mu$m to approximately 10 $\mu$m.

3. A structure as in claim 1 wherein the gate width is in the range of approximately 1.6 $\mu$m to approximately 150,000 $\mu$m.

4. A structure as in claim 1 further having a protective circuit chosen from the group consisting of diode and capacitor circuits.

5. A structure as in claim 1 wherein the peripheral transistors are selected from the group of transistors consisting essentially of PMOS, NMOS, Intrinsic NMOS, Z-type NMOS and high voltage transistors.

6. A structure as in claim 5 wherein the number of fingers is chosen such that the total gate width of the finger transistor is equal to the gate width of the total number of peripheral transistors.

7. A structure as in claim 6 wherein the peripheral transistors comprise PMOS transistors.

8. A structure as in claim 6 wherein the peripheral transistors comprise NMOS transistors.

9. A device for testing a flash memory chip comprising:
    a substrate;
    an array of memory cells on the substrate;
    peripheral transistors associated with the array of memory cells; and
    at least one test circuit structure for testing the peripheral transistors, the test structure having
        a gate length,
        a gate width, and
        a number of fingers electrically connected to the peripheral transistors.

10. A device as in claim 9 wherein the test structure gate length is in the range of approximately 0.07 $\mu$m to approximately 10 $\mu$m.

11. A device as in claim 9 wherein the test structure gate width is in the range of approximately 1.6 µm to approximately 150,000 µm.

12. A device as in claim 9 further having a protective circuit chosen from the group consisting of diode and capacitor circuits.

13. A test structure for testing a flash memory chip peripheral control transistor simulated leakage current comprising:
- a substrate;
- an array of memory cells on the substrate;
- at least one peripheral control transistor associated with the array of memory cells;
- means for testing the at least one peripheral transistor simulated leakage current, said means comprising at least one finger transistor having
    - a gate length in the range of approximately 0.07 µm to approximately 10 µm,
    - a gate width equal to the gate width of the at least one peripheral transistor, and
    - a number of fingers electrically connected to the at least one peripheral transistor.

14. A structure as in claim 13 wherein the peripheral transistors are selected from a group of transistors consisting of PMOS, NMOS, intrinsic NMOS, Z-type NMOS and high voltage transistors.

15. A structure as in claim 14 wherein the at least one finger transistor has a gate width in the range of approximately 1.6 µm to approximately 150,000 µm.

16. A structure as in claim 15 wherein the number of fingers is chosen such that the total gate width of the finger transistor is equal to the gate width of a number of peripheral transistors.

17. A structure as in claim 13 wherein the peripheral transistors comprise PMOS transistors.

18. A structure as in claim 13 wherein the peripheral transistors comprise NMOS transistors.

19. A device as in claim 13 further having a protective circuit chosen from a group consisting of diode and capacitor circuits.

20. A structure as in claim 19 wherein the at least one finger transistor has a gate width in the range of approximately 1.6 µm to approximately 150,000 µm and the number of fingers is chosen such that the total gate width of the finger transistor is equal to the gate width of a number of peripheral transistors.

* * * * *